United States Patent
Mukoyama et al.

(10) Patent No.: US 7,684,459 B2
(45) Date of Patent: Mar. 23, 2010

(54) SEMICONDUCTOR LASER APPARATUS AND FABRICATION METHOD OF THE SAME

(75) Inventors: Naotaka Mukoyama, Kanagawa (JP); Hideo Nakayama, Kanagawa (JP); Akemi Murakami, Kanagawa (JP); Ryoji Ishii, Kanagawa (JP); Yasuaki Kuwata, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 0 days.

(21) Appl. No.: 11/338,739

(22) Filed: Jan. 25, 2006

(65) Prior Publication Data

US 2007/0091952 A1    Apr. 26, 2007

(30) Foreign Application Priority Data

Aug. 18, 2005   (JP)   ............ 2005-237451

(51) Int. Cl.
*H01S 3/097* (2006.01)
(52) U.S. Cl. ............ 372/87; 372/45.01; 372/50.124; 372/81; 372/99
(58) Field of Classification Search ............ 372/45.01, 372/46.01, 50.124, 81, 87, 99
See application file for complete search history.

(56) References Cited

U.S. PATENT DOCUMENTS

| | | | | |
|---|---|---|---|---|
| 4,425,650 A | * | 1/1984 | Mito et al. | ............ 372/46.01 |
| 4,680,602 A | * | 7/1987 | Watanabe et al. | ............ 257/13 |
| 4,740,977 A | * | 4/1988 | Ikeda | ............ 372/45.01 |
| 5,063,569 A | * | 11/1991 | Xie | ............ 372/45.01 |
| 5,559,819 A | * | 9/1996 | Abe et al. | ............ 372/46.01 |
| 5,963,572 A | * | 10/1999 | Hiroyama et al. | ............ 372/46.01 |
| 6,333,945 B1 | * | 12/2001 | Abe et al. | ............ 372/46.01 |
| 6,335,548 B1 | * | 1/2002 | Roberts et al. | ............ 257/98 |
| 6,529,541 B1 | * | 3/2003 | Ueki et al. | ............ 372/96 |
| 2002/0110169 A1 | * | 8/2002 | Iwai et al. | ............ 372/43 |
| 2004/0114652 A1 | * | 6/2004 | Yoshikawa | ............ 372/46 |

FOREIGN PATENT DOCUMENTS

| | | | | |
|---|---|---|---|---|
| JP | 61-166192 | * | 7/1986 | ........ 372/FOR. 104 |
| JP | A 6-37403 | | 2/1994 | |
| JP | A 2000-261085 | | 9/2000 | |
| JP | A 2003-200289 | | 7/2003 | |
| JP | A 2004-22608 | | 1/2004 | |
| JP | A 2004-55692 | | 2/2004 | |

* cited by examiner

*Primary Examiner*—Minsun Harvey
*Assistant Examiner*—Yuanda Zhang
(74) *Attorney, Agent, or Firm*—Oliff & Berridge, PLC (57) ABSTRACT

There is provided a semiconductor laser apparatus. An electrode of a semiconductor laser diode is bonded via a die attach and the electrode of the semiconductor laser diode includes Au and at least one of materials that compose the die attach except Au, in advance.

7 Claims, 9 Drawing Sheets

|  | FIRST BACKSIDE ELECTRODE | SECOND BACKSIDE ELECTRODE | DIE ATTACH | THICKNESS [μm] | STRENGTH [cN] | VARIATION [%] |
|---|---|---|---|---|---|---|
| FIRST TEST EXAMPLE | Au/Ge/Au | Sn | Au-Sn | 200 | 350 | LESS THAN 3% |
| SECOND TEST EXAMPLE | Au/Ge/Au | Sn | Au-Sn | 100 | 300 | LESS THAN 5% |
| THIRD TEST EXAMPLE | Au/Ge/Au | In | In-Ag | 100 | 300 | LESS THAN 7% |
| FIRST COMPARATIVE EXAMPLE 1 | Au/Ge/Au | NOT PROVIDED | Au-Sn | 100 | 240 | LESS THAN 20% |
| SECOND COMPARATIVE EXAMPLE 2 | Au/Ge/Au | NOT PROVIDED | Ag PASTE | - | 280 | LESS THAN 35% |

SEMICONDUCTOR LASER APPARATUS AND FABRICATION METHOD OF THE SAME

BACKGROUND OF THE INVENTION

1. Field of the Invention

This invention relates to a semiconductor laser apparatus with the use of vertical cavity surface emitting laser diode (hereinafter, referred to as VCSEL), and in particular, a semiconductor laser apparatus and fabrication method thereof, the semiconductor laser apparatus being in use as a light source for optical information processing and optical communication or the light source of a data storage memory apparatus that stores data by means of laser beam.

2. Description of the Related Art

With increased data communication capacity of these years, there is a demand for a semiconductor laser apparatus having a higher speed and higher reliability, in which the semiconductor laser diodes are formed into an array. The laser diode is mounted on a package in accordance with the standard TO-CAN packaging in general usage, yet it is known that the die bonding of the chip greatly influences the operation life and reliability of the chip.

In general, when the chip such as VCSEL or the like is die-bonded, a die attachment is utilized for bonding. Therefore, it is important to select a die attach material that a thermal expansion coefficient is close to that of the laser chip, the bonding strength is excellent, and thermal conductivity is high. For this reason, the bonding method is employed with a metal alloy-based die attach material such as Au—Sn solder, Sn—Pb solder, or the like, which is excellent in heat release.

For instance, Japanese Patent Application Publication No. 2004-22608 (hereinafter, referred to as Document 1) describes an anchor structure in which multiple mountain-valley patterns are formed on a boundary between an Au—Sn alloy and a solder layer that includes Sn subsequent to bonding in order to strengthen the solder bonding.

Japanese Patent Application Publication No. 2003-200289 (hereinafter, referred to as Document 2) describes that when two members are bonded to form an Au—Sn alloy, the mass fraction of Sn is configured equal to or less than 13 percent by mass in the composition of the Au—Sn alloy in the bonding portion, subsequent to bonding.

Japanese Patent Application Publication No. 2000-261085 (hereinafter, referred to as Document 3) describes a laser diode apparatus in which the laser diode is soldered to a submount and the submount is soldered to the stem. The solder layers are respectively formed in the laser diode and the submount before the solder joint.

Japanese Patent Application Publication No. 6-37403 (hereinafter, referred to as Document 4) describes a structure in which the tin film for mounting the semiconductor laser diode on the submount is surrounded by the gold film having same thickness so that the gold-tin alloy-based solder may not be extruded to the back end surface of the semiconductor laser at the time of die-bonding the semiconductor laser diode. The laser beam emitted from the back end surface is not diverged by the solder, thereby reducing the deterioration with age of the monitoring current.

Japanese Patent Application Publication No. 2004-55692 (hereinafter, referred to as Document 5) describes a structure that includes the submount, the semiconductor laser diode, and the alloy layer disposed between the submount and the semiconductor laser diode. The alloy layer is composed of a portion of the electrode of the semiconductor laser diode and the solder layer provided on the submount in advance, and the Sn content included in the alloy layer is configured equal to or less than 26 percent by mass. It is possible to suppress Sn to condense in the laser beam emitting region during operation, by reducing the Sn content. This prevents the laser oscillation from stopping.

The package having the chip such as VCSEL or the like mounted thereon, sometimes operates under high temperatures. For instance, in a selectively oxidized VCSEL, a distortion is generated due to the difference in the thermal expansion coefficient between the current confinement region having the oxidation region and the active region provided close thereto. This adversely affects the operation characteristics of the optical output and the like in some cases. Therefore, it is necessary to suppress the heat generated in VCSEL as much as possible. This is why the metal solder material of Au—Sn or the like having an excellent heat release characteristic is employed for the die attach of the chip. However, the metal solder material has a higher bonding temperature than that of the plastic die attach material of a sliver paste or the like, and this high temperature thermally affects the inside of the VCSEL. Consequently, there is the probability that the reliability of the device will be degraded. In contrast, if the bonding temperature between the metal solder materials is lowered, the bonding strength between the metal solder material is reduced. The chip is, in some cases, peeled from the die attach or mounter in a subsequent bonding process or the like.

Document 1, on the other hand, describes that a hard and weak Au—Sn compound is difficult to be formed because the solder layer that includes Sn and the Au—Sn alloy layer are well blended together. However, it is difficult to control the mountain-valley patterns on the boundary with high repeatability. If the partially weak Au—Sn compound is formed, there is a problem that the chip will be peeled from the weak portion.

In addition, Document 2 proposes the object of preventing remelting of solder in a former bonding when the laser chip is bonded to the heat sink. However, if the Sn content is too small, it is easy to form an Au-rich layer that is hard and weak. This causes drawbacks that the chip is peeled from the mount at the time of driving or the operation life is shortened because of the thermal stress generated during operation. As described heretofore, there are several problems that should be solved to obtain the semiconductor laser apparatus in which the bonding strength between the metal solder material and the chip is kept with the high reliability.

With a semiconductor laser apparatus or a package thereof in accordance with the present invention, the above-described problems or drawbacks can be solved by including Au and at least one of constituent materials of the die attach material, except Au, in the material for a lower electrode.

SUMMARY OF THE INVENTION

The present invention has been made in view of the above circumstances and realizes an excellent bonding characteristic between an electrode and a die attach of a semiconductor laser diode to provide a semiconductor laser apparatus and fabrication method thereof with high reliability and long operation life. In addition, the present invention provided the semiconductor laser apparatus and fabrication method thereof, whereby the electrode of the semiconductor laser diode is bonded to the die attach at comparatively low temperatures.

According to one aspect of the present invention, there may be provided a semiconductor laser apparatus. An electrode of a semiconductor laser diode may be bonded via a die attach;

and the electrode of the semiconductor laser diode may include Au and at least one of materials that compose the die attach except Au, in advance.

According to another aspect of the present invention, there may be provided a semiconductor laser apparatus including a case main body; a mounter attached to the case main body; multiple lead pins; and connection wires that couples said multiple lead pins and an electrode of a semiconductor laser diode. The semiconductor laser diode may be mounted on the mounter via the die attach; and the electrode of the semiconductor laser diode may include Au and at least one of materials that compose the die attach except Au, in advance.

According to another aspect of the present invention, there may be provided a semiconductor laser apparatus having a surface emitting laser diode including a lower reflector deposited on a substrate; an active region; an upper reflector that composes an oscillator with the lower reflector; a metal portion in which a first opening is formed to define an emitting region of laser beam generated in the active region; a light confinement region having a second opening that defines the emitting region of laser beam provided between the metal portion and the lower reflector. An electrode of the surface emitting laser diode may be bonded via a die attach; and the electrode of the surface emitting laser diode may include Au and at least one of materials that compose the die attach except Au, in advance.

According to another aspect of the present invention, there may be provided an optical transmission apparatus including: the above-mentioned semiconductor laser apparatus; and a transmission portion that transmits a light emitted from the semiconductor laser apparatus over an optical medium.

According to another aspect of the present invention, there may be provided a free space optical transmission apparatus including: the above-mentioned semiconductor laser apparatus; and a transmission portion that transmits a light emitted from the semiconductor laser apparatus for free space transmission.

According to another aspect of the present invention, there may be provided an optical transmission system including: the above-mentioned semiconductor laser apparatus; and a transmission portion that transmits a light emitted from the semiconductor laser apparatus.

According to another aspect of the present invention, there may be provided a free space optical transmission system including: the above-mentioned semiconductor laser apparatus; and a transmission portion that transmits a light emitted from the semiconductor laser apparatus for free space transmission.

According to another aspect of the present invention, there may be provided a fabrication method of a semiconductor laser apparatus in which an electrode of a semiconductor laser diode is bonded via a die attach, the fabrication method including: forming the electrode that includes Au and at least one of materials that compose the die attach except Au, in advance; and bonding the electrode of the semiconductor laser diode to the die attach at given temperatures.

BRIEF DESCRIPTION OF THE DRAWINGS

Embodiments of the present invention will be described in detail based on the following figures, wherein.

DESCRIPTION OF THE EMBODIMENTS

A description will now be given, with reference to the accompanying drawings, of embodiments of the present invention.

A description will be given of a semiconductor laser apparatus in accordance with an embodiment of the present invention. A semiconductor laser diode to be mounted on a semiconductor laser apparatus in accordance with embodiments of the present invention includes a same material as a constituent material of the die attach material in advance, in addition to Au, as an electrode material to be bonded to the die attach material. For this reason, an Au-rich layer is not created during the bonding process, and the chip will not be peeled during subsequent processes or operation. Also, the same material as the die attach material is included, thereby it is possible to obtain a semiconductor laser package in which wettability is excellent in the heated bonding, leading to the excellent heat release, high reliability, and long operation life. For instance, referring to FIG. 1, a semiconductor laser diode 100 includes multiple semiconductor layers 120 deposited on a substrate 110. The semiconductor layers 120 include an active region 126 and the like, sandwiched between higher and lower resonators 122 and 124, and the laser beam generated in the active region 126 is emitted in a direction vertical to the substrate 110. A backside electrode 130 of the substrate 110 includes an Au-rich suppression layer 140, which is composed of Au and at least one of the materials, yet except Au, included in the die attach material. The Au-rich suppression layer 140 may be blended together with the backside electrode 130. An electrode layer deposited together with the backside electrode 130 is desirable. The backside electrode 130 is bonded to a die attach 150, which is fabricated of a metal solder material, via the Au-rich suppression layer 140. The backside electrode 130 may be a multi-layered electrode later of Au/Sn/Au. The Au-rich suppression layer 140 is fabricated of Sn, and the die attach 150 is fabricated of an Au—Sn eutectic metal.

Figure 1:
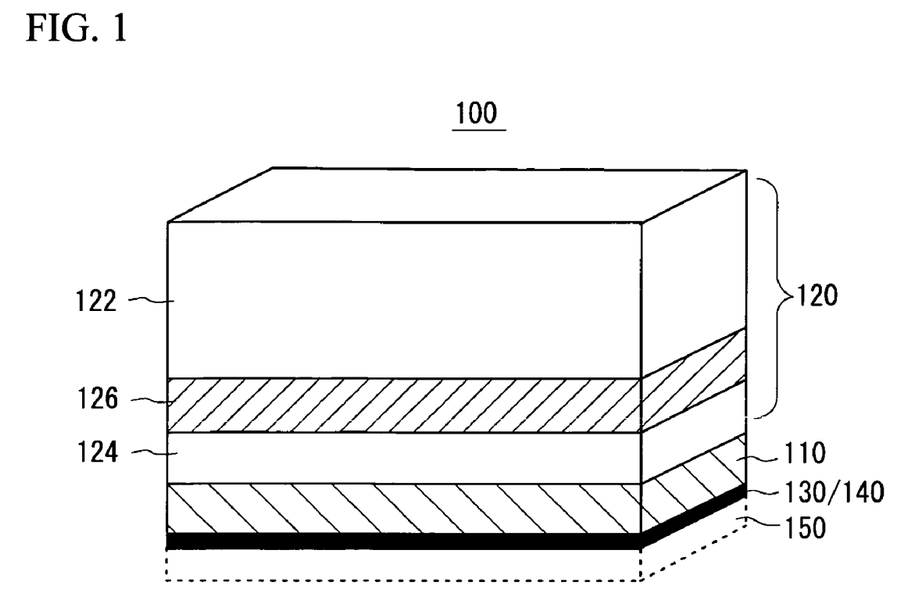
FIG. 1 is a view showing a configuration of a semiconductor laser apparatus in accordance with the present invention.

Other than Au, Sn, Pb, In, Sb, and Ag are described as other constituent materials of the die attach materials included in the backside electrode 130, in accordance with the present embodiment. In particular, Sn, In, Sb, and Ag are desirable to meet the requirement for Pb-free products of these years, yet the constituent materials are not limited to the afore-mentioned ones, if included in the die attach material to be employed, except Au. Specifically, the semiconductor laser package with high reliability is obtainable by including a soft solder such as In in the backside electrode as a die attach material as necessary, without releasing the stress at the time of driving and thereby degrading the crystallization of the semiconductor laser.

As a material in the backside electrode, the material that includes Ge is especially desirable, because it exhibits an excellent ohmic contact, in addition to Au and another material included in the die attach material, except Au. For instance, the backside electrode may be configured to be Au/Ge/Au/Sn.

Any known method may be employed for forming the material of the backside electrode in accordance with the present embodiment. Examples are the vacuum deposition, sputtering, CVD, plating, application, and printing. In particular, the vapor vacuum deposition is desirable owing to the excellent film-thickness controllability thereof.

Any known solder material may be employed for the die attach material in accordance with the present embodiment. Examples are Au—Sn, Sn—Pb, In—Sn, In—Ag, Sn—Sb, In—Pb, In, Au—Sb, Sn—Cu, and the like. Among the aforementioned materials, Au—Sn-based die attach material is desirable because of the excellent heat release characteristic.

A known form such as ribbon, pellet, ball, or the like may be employed as a form of the die attach material. As for the thickness of the die attach material, the die attach material having the thickness of equal to or more than 10 µm may be bonded, yet it is especially desirable if it is 100 µm or more because of the excellent bonding strength.

A known mounting substrate, mounter, lead frame, or the like may be utilized for a base in accordance with the present invention. Examples of the mounting substrate include TO header, submount material, QFP type, DIP type, and PGA type. In addition, a known laser diode may be employed for the semiconductor laser diode in accordance with the present invention. Examples are CD laser, DBR laser, DFB laser, psuedomorphic quantum well laser, multi-quantum well barrier type laser diode, blue laser diode, and surface emitting laser. Among the afore-mentioned lasers, the vertical cavity surface emitting laser diode (VCSEL) is especially desirable, because VCSEL is a laser diode whose light is emitted from the surface of the semiconductor substrate, and has the following characteristics: (1) low drive current, (2) characteristic testability on wafer, and (3) easy formation into array.

Figure 2:
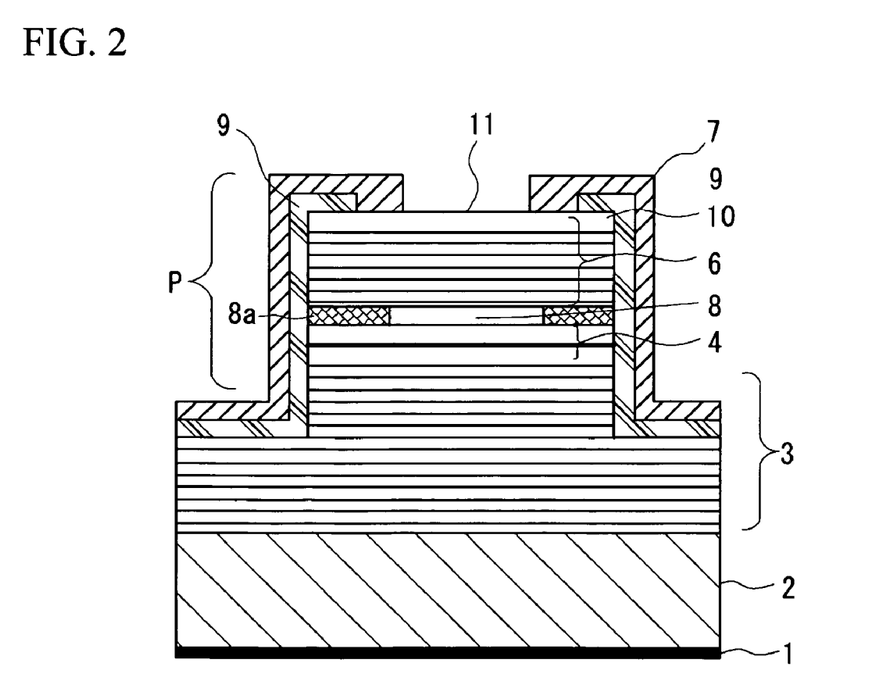
FIG. 2 is a cross-sectional view of a VCSEL.

FIG. 2 is a cross-sectional view showing a configuration of VCSEL. The VCSEL includes a lower reflector 3, an active region 4, and an upper reflector 6. Those semiconductor thin films are successively deposited on a substrate 2 fabricated of GaAs or the like with which a lower electrode 1 is formed. An upper electrode 7 is provided above the upper reflector 6 via a contact layer 10. There is provided a circular emitting aperture 11 in the upper electrode 7. In addition, a current funneling structure 8 is provided adjacently to the active region 4 in order to obtain a high gain distribution inside the active region. The laser beam generated in the active region 4 is externally emitted from the emitting aperture 11 of the upper electrode 7. An interlayer insulating film 9 may be fabricated to cover a post structure P having a shape of cylinder above the substrate 2.

One of known methods may be selected for the current funneling structure 8 of the VCSEL in accordance with the present embodiment. The methods include an implantation type of VCSEL that partially lowers the electric conductivity by irradiating hydrogen ions on the surface and an oxidized VCSEL in which the reflector is oxidized from the outside to form an insulation layer. However, it is desirable to include the current funneling portion having an oxidized high-resistance region in which the power consumption is small, no kink appears in the current-optical output characteristics, and fast responsiveness is good.

An opening 8a may be formed in the center by oxidizing the semiconductor layer having a relatively high proportion of Al from a side face of the post structure P having a shape of cylinder formed above the substrate 2 so that the high-resistance region is included as the current funneling structure 8. It is desirable to have a diameter of the opening 8a of equal to or less than 20 µm in accordance with the present invention, and especially, the opening 8a of less than 5 µm is desirable, because the single mode can be realized and the fast modulation capability is excellent.

In particular, VCSEL having the opening 8a of less than 5 µm has a failure probability greater than that having the opening 8a of equal to or more than 5 µm. However, with the VCSEL in accordance with the present invention, it is possible to provide the surface emitting laser apparatus having a high reliability and long operation life.

Hereinafter, a description will be given of the configuration and the fabrication method of VCSEL in accordance with embodiments of the present invention, yet the present invention is not limited to the following embodiments.

Embodiments

A first embodiment of the present invention will be described. A VCSEL in accordance with the first embodiment, as exemplarily illustrated in FIG. 3, there are successively provided on a (100) plane of an n-type GaAs substrate 14 by the metalorganic chemical vapor deposition (MOCVD) process, a lower multi-layered reflection film 15, an active region 16, a p-type AlAs layer 17, an upper multi-layered reflection film 18, and a contact layer 22. The lower multi-layered reflection film 15 is fabricated of a multi-layered laminated body of n-type $Al_{0.8}Ga_{0.2}As$ layers and n-type $Al_{0.1}Ga_{0.1}As$ layers. The active region 16 is a laminated body that includes a spacer layer of undoped $Al_{0.4}Ga_{0.6}As$ layer, a barrier layer of undoped $Al_{0.2}Ga_{0.8}As$ layer, and a quantum well layer of undoped GaAs layer. The upper multi-layered reflection film 18 is fabricated of a multi-layered laminated body that includes p-type $Al_{0.8}Ga_{0.2}As$ layers and p-type $Al_{0.1}Ga_{0.9}As$ layers. The contact layer 22 is fabricated of a p-type GaAs layer.

Figure 3:
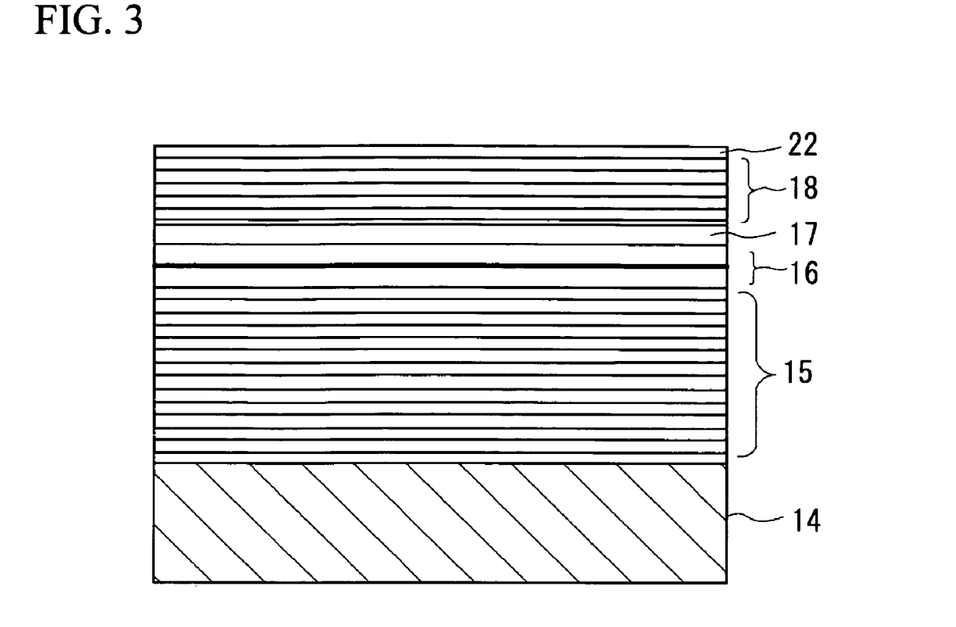
FIG. 3 is a cross-sectional view schematically showing a fabrication process of a VCSEL in accordance with an embodiment of the present invention.

The lower multi-layered reflector 15 is fabricated of a multi-layered laminated body that includes the n-type $Al_{0.8}Ga_{0.2}As$ layers and n-type $Al_{0.1}Ga_{0.9}As$ layers. The thickness of each layer corresponds to $\lambda/4$ nr, where $\lambda$ denotes an oscillation wavelength and nr denotes an optical reflective index in medium. 36.5 periods of layers having different mix crystal ratios are alternately deposited. $3\times10^{18}$ cm$^{-3}$ is a carrier density after silicon is doped as an n-type impurity. The active region 16 is designed as follows: a laminated body is sandwiched between the spacer layers of undoped $Al_{0.4}Ga_{0.6}As$ layers, and this laminated body is composed of one or more quantum well layers fabricated of undoped GaAs layers having thickness of 8 nm and barrier layers fabricated of undoped $Al_{0.2}Ga_{0.8}As$ layer having thickness of 5 nm, whereas the quantum well layer and the barrier layer are alternately laminated so that the barrier layers serve as outermost layers. The thickness of the spacer layer that includes the quantum well layer and the barrier layer is designed to be an integral multiplication of $\lambda/4$ nr. The beam having the wavelength of 850 nm is emitted from the active region 16 with the above-mentioned configuration.

The upper multi-layered reflector 18 is a laminated body that includes multiple semiconductor layers of p-type $Al_{0.8}Ga_{0.2}As$ layers and p-type $Al_{0.1}Ga_{0.9}As$ layers. The thickness of each layer is $\lambda/4$ nr, which is same as that of the lower multi-layered reflector 15, and 22 periods of layers having different mix crystal ratios are alternately laminated. The number of the afore-mentioned periods is the number of the AlAs layers 17 provided on the lower layer added to that of the contact layers 22 provided on the upper layer. However, with respect to the AlAs layer 17, the materials included in the thickness of $\lambda/4$ nr are not necessarily fabricated of AlAs. On the contrary, there is a problem that the optical divergence loss will be increased, in some cases, if the AlAs layer 17 is made thicker than necessary. Therefore, the AlAs layer 17 is designed to have thickness of 30 nm, and the remaining portion is fabricated of $Al_{0.9}Ga_{0.1}As$. $3\times10^{18}$ cm$^{-3}$ is a carrier density after carbon is doped as a p-type impurity.

Figure 4:
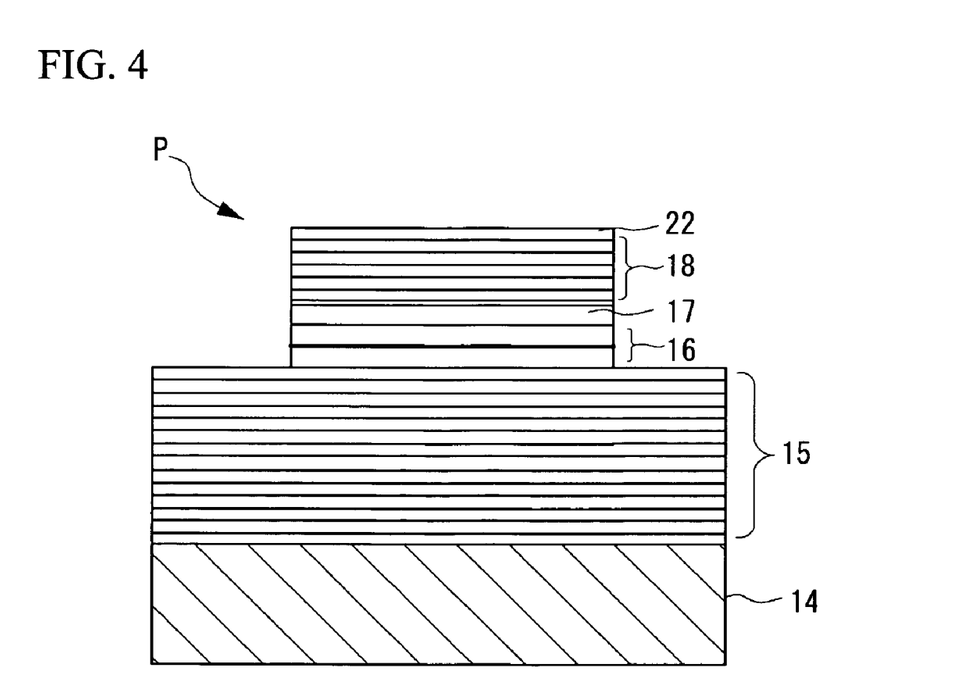
FIG. 4 is a cross-sectional view schematically showing a fabrication process of the VCSEL in accordance with an embodiment of the present invention.

The laser substrate, on which the lower multi-layered reflector 15, the active region 16, the AlAs layer 17, the upper multi-layered reflector 18, and the contact layer 22 are successively deposited on the semiconductor substrate 14, is taken out from a growth chamber to form the structure of the cylindrical post P shown in FIG. 4 by the photolithography and anisotropic etching processes. At this time, an etch depth is set to a depth to reach a portion of the active region 16. This is because the side face of the AlAs layer 17, which is an original layer of this region, has to be exposed for a later oxidation process of forming the current funneling portion, also serving as the light confinement portion. Hence, on the oxidized laser diode, at least AlAs layer 17 has to be exposed from the side face of the post P, and the etch depth may pass through the active region 16 and reach a portion of the lower multi-layered reflector 15.

Figure 5:
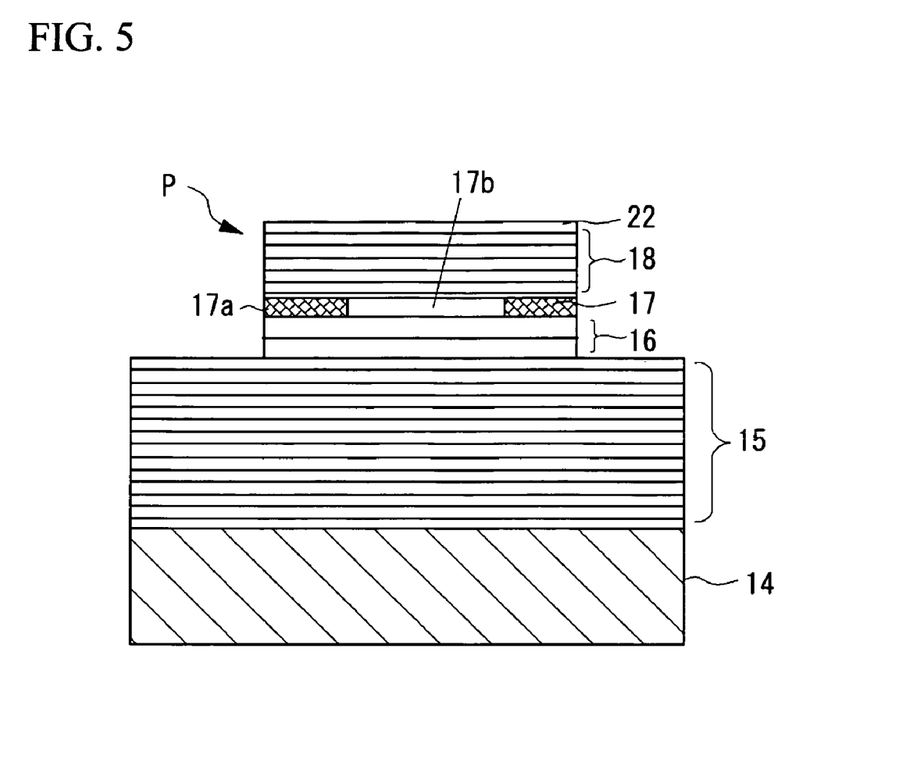
FIG. 5 is a cross-sectional view schematically showing a fabrication process of the VCSEL in accordance with an embodiment of the present invention.

After the post (mesa) is processed in the upper multi-layered reflector 18 in this manner, referring to FIG. 5, the semiconductor substrate is exposed to a water vapor atmosphere of 340° C. for 40 minutes with a carrier gas that includes nitrogen (flow rate: 2 litters/minute), for oxidation process. The AlAs layer 17 that composes a portion of the upper multi-layered reflector 18 has an oxidation rate higher than those of the $Al_{0.8}Ga_{0.2}As$ layer and the $Al_{0.1}Ga_{0.9}As$ layer that compose another portion thereof. For this reason, an oxidation region 17a that reflects the shape of the post is provided immediately on the active region 16, which is also included in the post P. A non-oxidized region 17b that is left without oxidized serves as a current injection region or current flowing region. That is to say, the oxidation region 17a functions as the current funneling region, also serving as the light confinement region simultaneously, because the optical refractive index is approximately half as much as that of the surrounding semiconductor layers. When a diameter of an opening of the non-oxidized region 17b obtained in the afore-described processes was measured, it was 3 μm.

Figure 6:
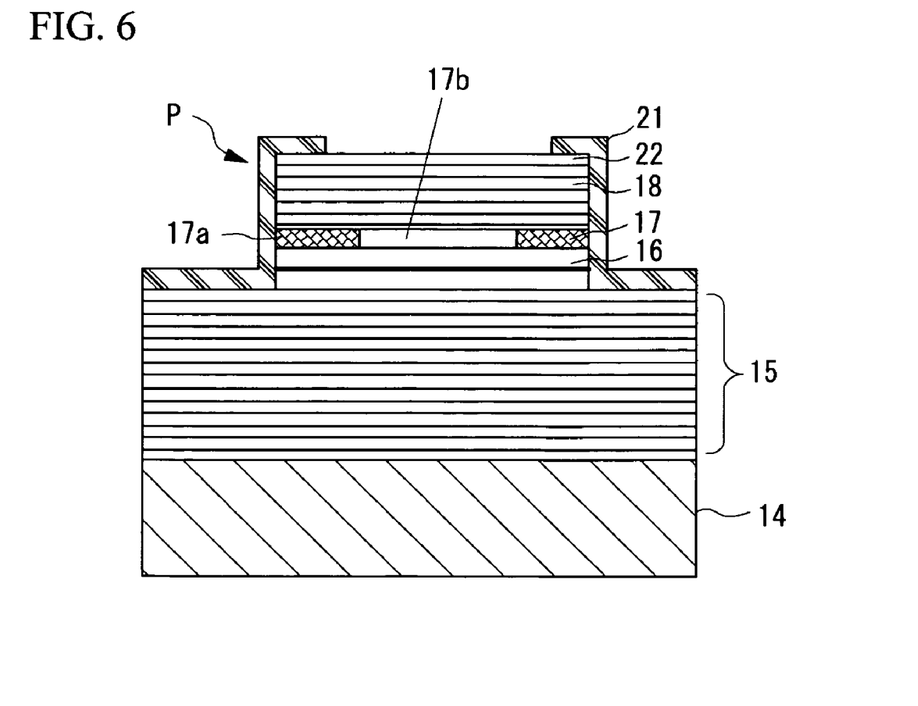
FIG. 6 is a cross-sectional view schematically showing a fabrication process of the VCSEL in accordance with an embodiment of the present invention.

Then, after the insulation film of silicon oxide or the like is formed on the substrate that includes the side face of the exposed post P, the insulation film is patterned and removed to partially expose the top of the post to the contact layer 22 to provide an interlayer insulating film 21, as shown in FIG. 6.

Figure 7:
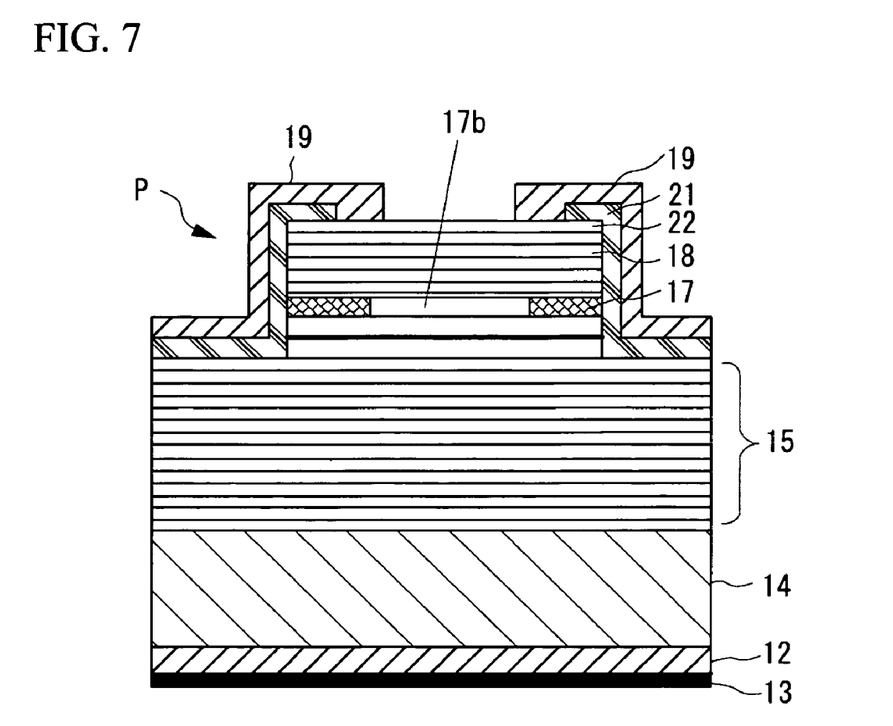
FIG. 7 is a cross-sectional view schematically showing a fabrication process of the VCSEL in accordance with an embodiment of the present invention.

Subsequently, as shown in FIG. 7, a p-type upper electrode 19 is formed on the top of the post to establish an electric contact with the contact layer 22, and the emitting aperture 11 is formed in the top thereof. Then, a first backside electrode 12 is formed by electron beam evaporation so that Au, Ge, and Au are deposited to respectively have the thickness of 100 nm, 50 nm, and 100 nm on the backside of the substrate 14, and is annealed at 350° C. Lastly, a second backside electrode 13 is formed to form Sn of the film thickness of 20 nm by the electron beam evaporation, and a VCSEL 60 in accordance with an embodiment of the present invention is obtained.

Figure 8:
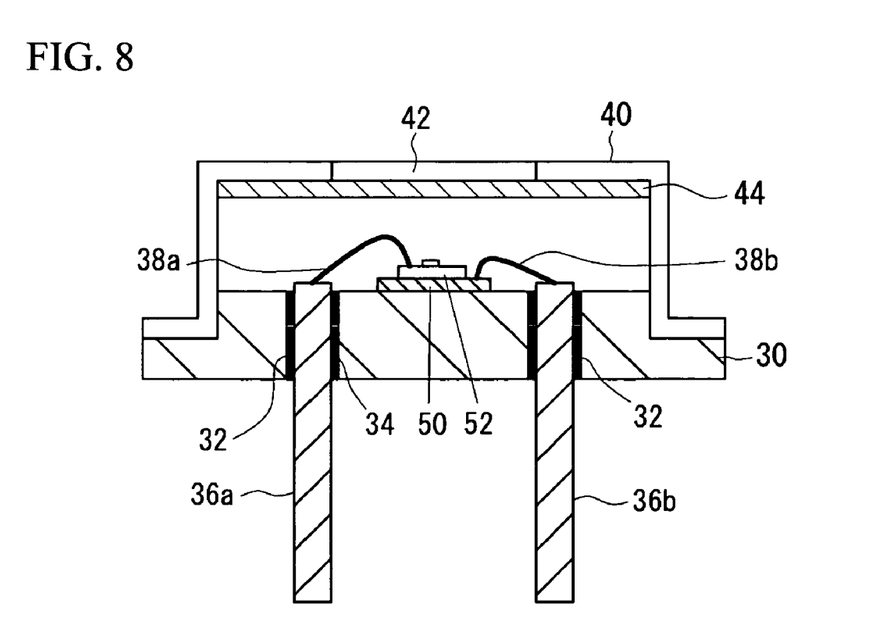
FIG. 8 is a cross-sectional view schematically showing a configuration in which a VCSEL chip is mounted according to CAN packaging.

Such VCSELs fabricated on a wafer are diced into chips as necessary. FIG. 8 is a cross-sectional view schematically illustrating a package configuration of the semiconductor laser apparatus in which the chip is mounted on a CAN. The semiconductor laser apparatus includes a metal stem (or case main body) 30 and a metal cap 40 attached to the metal stem 30. Through holes 32 are provided in the metal stem 30. The through holes 32 are coated with insulation films 34. Lead pins 36a and 36b are inserted thereinto. A VCSEL chip 52 is mounted on the mounter 50, which is provided on the surface of the metal stem 30. The lead pin 36a is electrically coupled to the upper electrode 19 of the chip 52 by a bonding wire 38a, and the lead pin 36b is electrically coupled to the backside electrodes 12 and 13 of the VCSEL chip 52 by a bonding wire 38b.

An emitting aperture 42 having a shape of circle is provided in the center of the cap 40. A transmitting glass 44 is attached to the backside of the cap 40. When drive currents are applied to the lead pins 36a and 36b, the laser beam is emitted in a direction in parallel with the substrate from the emitting aperture 11, and is further emitted to the outside via the emitting aperture 42.

The VCSEL chip 52 is fixed on a mounter 50, by heating at 300° C. together with the die attach of the Au—Sn pellet having the thickness of 200 μm mounted on the mounter 50. Subsequently, the bonding wires 38a and 38b are bonded in the wire bonding process, the sealing process of the cap 40 is implemented, and the laser package shown in FIG. 8 is obtained.

Figure 9:
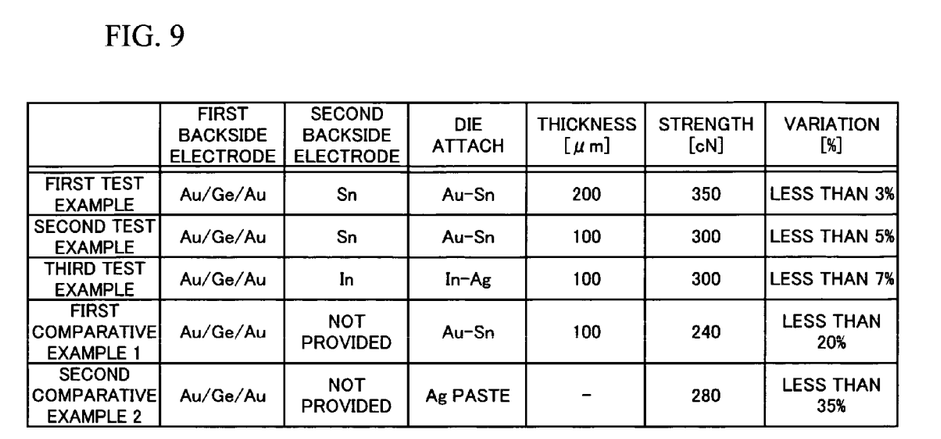
FIG. 9 is a table showing evaluation results of examples in accordance with the present invention and comparative examples.

The die shear test and temperature cycle test were implemented for reliability evaluation on the package in which the semiconductor laser apparatus in accordance with the present invention is included. Specifically, the reliability was evaluated by comparing the changes in electrochemical characteristic before and after 1000 cycles of the temperature change from −40° C. to 85° C. are repeated under the die shear test condition that complies with Standards of Electronic Industries Association of Japan: EIAJ ED-4703 and the temperature cycle test that complies with EIAJ-ED4701. FIG. 9 is a table showing the evaluation results of the examples in accordance with the present invention and comparative examples.

In a first test example, which corresponds to the first embodiment, the die shear strength was excellent, 350 cN, and variation in optical output subsequent to the temperature cycle test was less than 3 percent. A stable reliability can be confirmed.

A second test example will be described. The second test example has the same configuration as that of the first test example (the first embodiment), except that the Au—Sn pellet having the thickness of 100 µm. The package obtained in accordance with the second test example has the die shear strength was excellent, 300 cN, and the variation in optical output subsequent to the temperature cycle test was less than 5 percent. A stable reliability can be confirmed.

A third test example will be described. The third example has the same configuration as that of the first test example (the first embodiment), except that the second backside electrode layer is deposited with In by the electron beam evaporation to have the thickness of 20 nm and In—Ag pellet having the thickness of 100 µm is used. The package obtained in accordance with the third test example has the die shear strength was excellent, 300 cN, and the variation in optical output subsequent to the temperature cycle test was less than 7 percent. A stable reliability can be confirmed.

COMPARATIVE EXAMPLE 1

A comparative example 1 has the same configuration as that of the first example (the first embodiment), except that the second backside electrode layer was not provided and the Au—Sn pellet having the thickness of 100 µm was employed. The evaluation results were: the die shear strength of 240 cN, and the variation in optical output subsequent to the temperature cycle test was a 20 percent decrease in the light amount. The results were slightly inferior to those of the examples 1 through 3.

COMPARATIVE EXAMPLE 2

A comparative example 2 has the same configuration as that of the first example (the first embodiment), except that the second backside electrode layer was not provided and silver paste was used to bond the chip to the base. The evaluation results were: the die shear strength of 280 cN, and the variation in optical output subsequent to the temperature cycle test was a 35 percent decrease in the light amount. The results were inferior to those of the examples 1 through 3.

As described heretofore, in accordance with the embodiments of the present invention, it is possible to provide the surface emitting laser or the package thereof having excellent single mode or fast modulation characteristics, excellent bondability, and long operation life, by including Au and at least one of the die attach materials, except Au, in the materials of the lower electrode.

In the above-described embodiments, GaAs is employed for the material that composes the quantum well layer, yet the present invention is not limited to this material. For instance, a compound semiconductor material of group III to group V such as AlGaAs, InGaAs, GaInNAs, or the like may be used. In addition, the n-type GaAs substrate is employed for the substrate, yet the present invention is not limited to this material. For example, the p-type GaAs substrate may be used.

Furthermore, MOCVD technique has been described as the crystal growth method in accordance with the embodiments of the present invention, yet the present invention is not limited to the afore-mentioned one. Another technique may be employed for semiconductor layer deposition. For example, molecular beam epitaxy (MBE) may be used.

Moreover, the VCSEL chip having a single beam has been described in accordance with the present embodiment, yet a multi-spot VCSEL chip in which multiple emitting apertures are arranged in an array may be used.

The above-described embodiments have been exemplarily shown, and should not limit the scope of the present invention. Another method may be applicable to the scope of the present invention, and it should be apparent that modifications and adaptations to those embodiments may occur to one skilled in the art without departing from the scope of the present invention.

Figure 10:
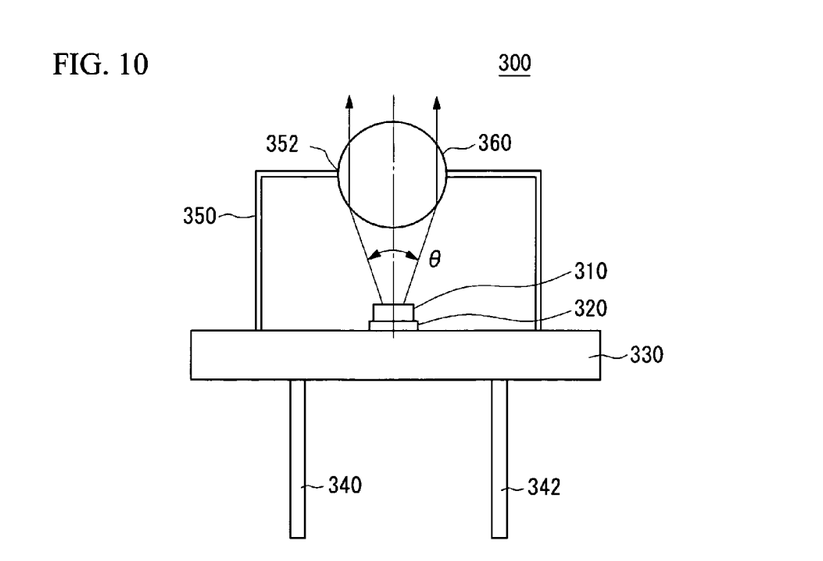
FIG. 10 is a cross-sectional view showing a configuration of a package on which the semiconductor chip having a VCSEL is mounted.

FIG. 10 is a cross-sectional view of a VCSEL chip, which is incorporated into a package (optical module). Referring to FIG. 10, a package 300 includes a chip 310 having the VCSEL. The chip 310 having the VCSEL is secured onto a disc-shaped metal stem 330 with a mounter 320. Conductive leads 340 and 342 are inserted into through-bores, not shown, provided in the stem 330. The conductive lead 340 is electrically coupled to a lower electrode formed on the backside of the chip 310, and the lead 342 is electrically coupled to an upper electrode formed on a top surface of the chip 310 respectively with bonding wires or the like.

A ball lens 360 is secured in an emitting aperture 352 of the cap 350. A light axis of the ball lens 360 is aligned on almost the center of the chip 310. The distance between the chip 310 and the ball lens 360 is adjusted so that the ball lens 360 may be included within an emitting angle θ of the laser beam emitted from the chip 310. A forward voltage is applied to the leads 340 and 342, and then the laser beam is emitted from the chip 310 and further emitted to the outside via the ball lens 360. A light receiving element may be included in the cap 350 so as to monitor an emitting state of the VCSEL.

Figure 11:
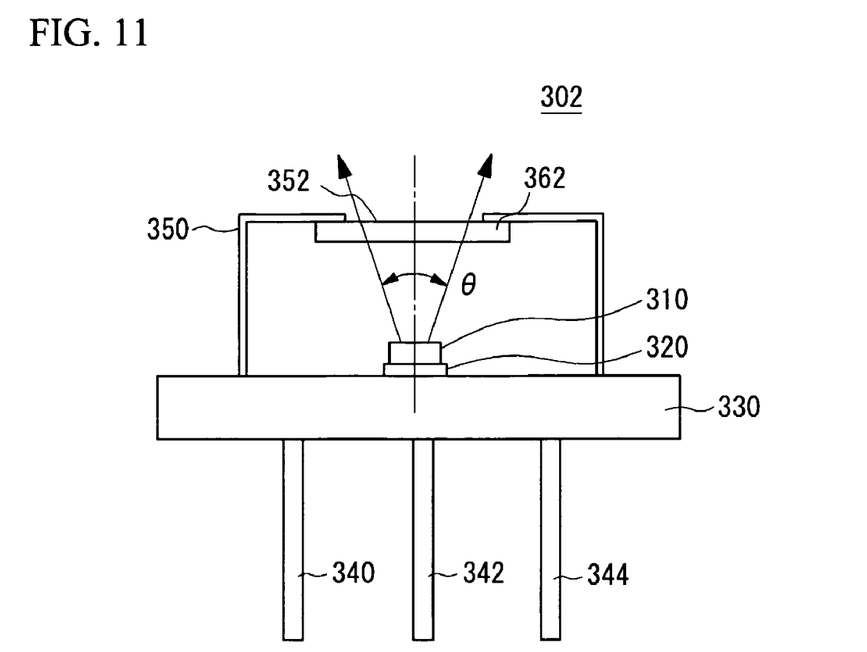
FIG. 11 is a cross-sectional view schematically showing another configuration of the package.

FIG. 11 shows another package configuration, which may be used for a free space transmission system, as will be described later. A package 302 shown in FIG. 11 includes a plate glass 362, instead of the ball lens 360. The plate glass 362 is secured in the emitting aperture 352 arranged in the center of the cap 350. The center of the plate glass 362 is aligned on almost the center of the chip 310. The distance between the chip 310 and the plate glass 362 is adjusted in such a manner that the diameter of the opening provided for the plate glass 362 may be greater than an emitting angle θ of the laser beam emitted from the chip 310.

Figure 12:
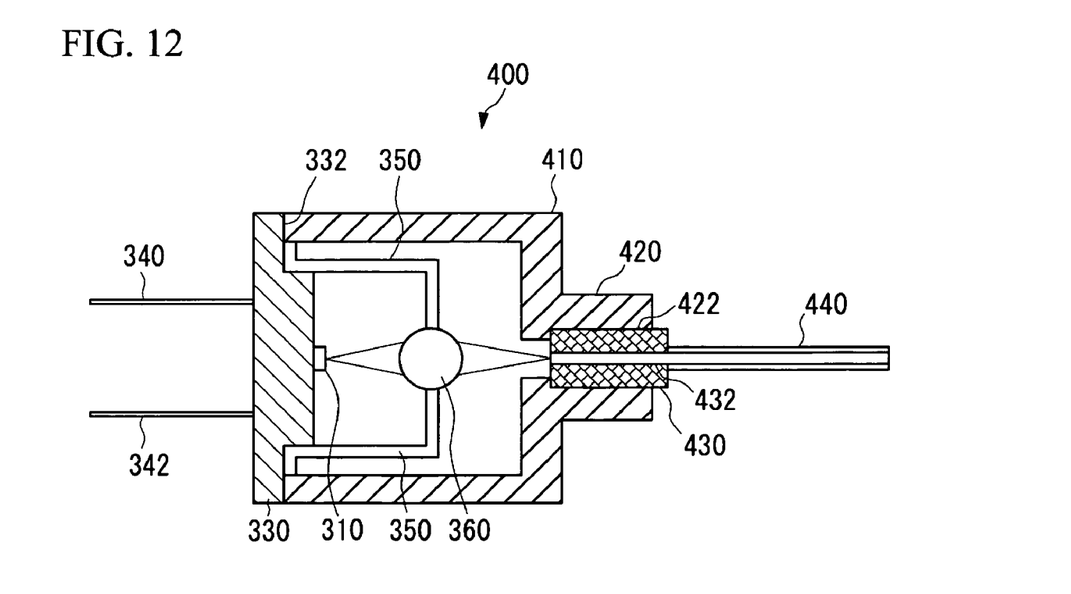
FIG. 12 is a cross-sectional view showing an optical transmission apparatus having the package shown in FIG. 10.

FIG. 12 is a cross-sectional view of an optical transmission apparatus to which the package or module shown in FIG. 10 is applied. An optical transmission apparatus 400 includes a chassis 410, a sleeve 420, a ferrule 430, and an optical fiber 440. The chassis 410 has a shape of cylinder, and is secured to the stem 330. The sleeve 420 is integrally formed with the chassis 410 on an edge of the chassis 410. The ferrule 430 is held inside an opening 422 of the sleeve 420. The optical fiber 440 is held by the ferrule 430.

An edge of the chassis 410 is secured to a flange 332 formed in a circumferential direction of the stem 330. The ferrule 430 is accurately positioned in the opening 422 of the sleeve 420, and the light axis of the optical fiber 440 is aligned with the light axis of the ball lens 360. A cable core of the optical fiber 440 is retained in a through-bore 432 of the ferrule 430.

The laser beam emitted from the surface of the chip 310 is focused by the ball lens 360. Such focused beam is incident to the cable core of the optical fiber 440, and is then transmitted. In the above-mentioned example, the ball lens 360 is employed, yet in addition, another type of lens such as a convexo-convex lens, plano-convex lens, or the like may be employed. Furthermore, the optical transmission apparatus 400 may include a drive circuit that applies electric signals to the leads 340 and 342. The optical transmission apparatus 400 may include a receiving function to receive optical signals via the optical fiber 440.

Figure 13:
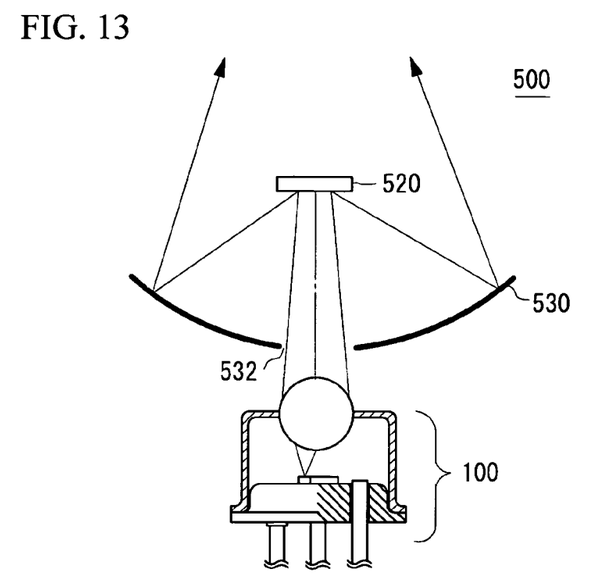
FIG. 13 is a view showing a configuration in which the package shown in FIG. 11 is used for a free space optical transmission.

FIG. 13 is a view showing a configuration in which the package shown in FIG. 11 is in use for a free space optical transmission system. A free space transmission system 500 includes the package 300, a light-condensing lens 510, a diffuser 520, and a reflection mirror 530. In the free space transmission system 500, the light-condensing lens 510 is employed instead of the ball lens 360 in use for the package 300. The light condensed by the light-condensing lens 510 is reflected by the diffuser 520 via an opening 532 of the reflection mirror 530, and is further reflected towards the reflection mirror 530. The reflection mirror 530 reflects such reflected light to a given direction for the optical transmission. The VCSEL of multi-spot type may be used as a light source of the free space optical transmission to obtain a high output.

Figure 14:
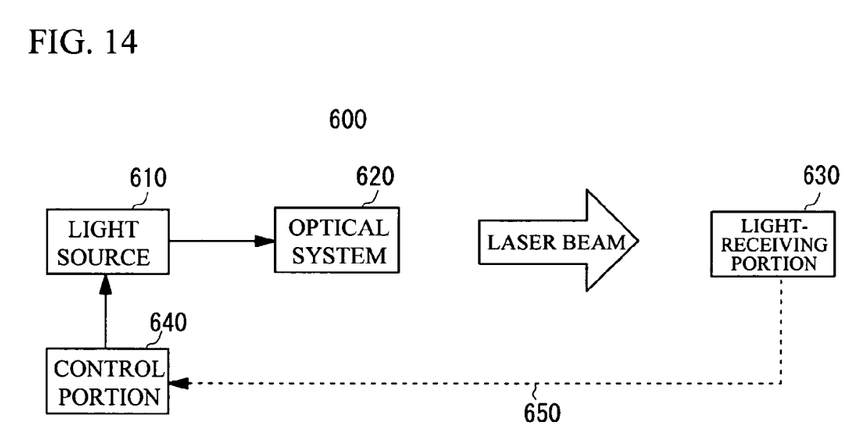
FIG. 14 is a block diagram showing a configuration of an optical transmission system.

FIG. 14 is a view showing a configuration example of an optical transmission system in which VCSEL is in use for a light source. An optical transmission system 600 includes a light source 610, an optical system 620, a light-receiving portion 630, and a controller 640. The light source 610 includes the chip 310 in which VCSEL is provided. The optical system 620 condenses the laser beam emitted from the light source 610. The light-receiving portion 630 receives the laser beam emitted from the optical system 620. The controller 640 controls to drive the light source 610. The controller 640 supplies drive pulse signals for driving the VCSEL to the light source 610. The light emitted from the light source 610 is transmitted to the light-receiving portion 630 by the optical fiber or a reflection mirror for a free space optical transmission via the optical system 620. The light-receiving portion 630 detects the received light be means of a photo detector or the like. The light-receiving portion 630 is capable of controlling the operation of the controller 640 (for example, the start timing of the optical transmission) with a control signal 650.

Figure 15:
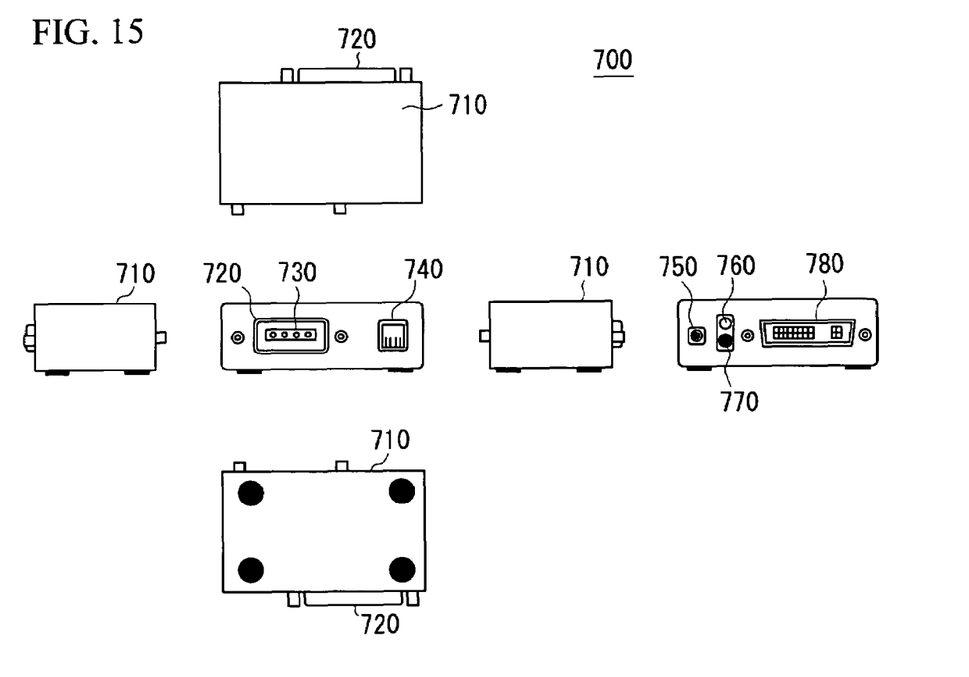
FIG. 15 is a view showing an outer appearance of the optical transmission apparatus.
Figure 16A:
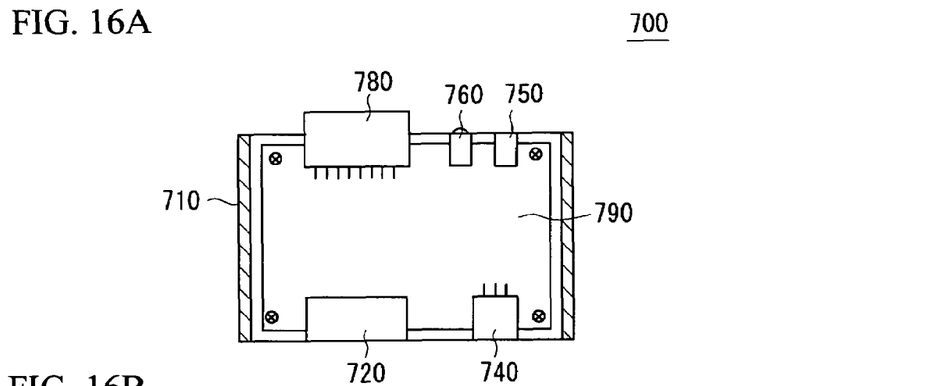
FIG. 16A is a top view of an internal configuration of the optical transmission apparatus.
Figure 16B:
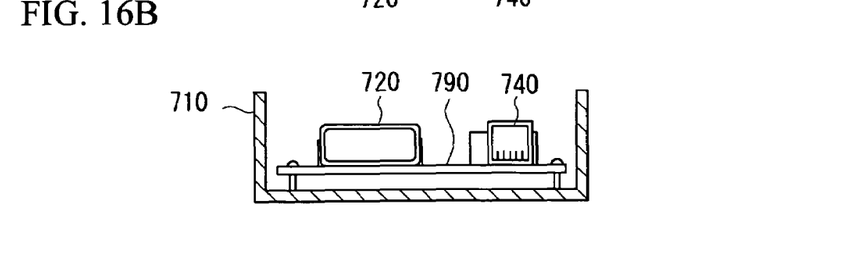
FIG. 16B shows a side view of the internal configuration of the optical transmission apparatus.

A description will now be given of an optical transmission apparatus used for the optical transmission system. FIG. 15 shows an outer appearance of the optical transmission apparatus, and FIGS. 16A and 16B show an internal structure thereof. An optical transmission apparatus 700 includes a casing 710, an optical signal transmission/reception connector joint portion 720, a light-emitting/light-receiving element 730, an electric signal cable joint portion 740, a power input portion 750, an LED 760 indicative of in operation, an LED 770 indicative of error, a DVI connector 780 and a transmission circuit board/reception circuit board 790.

Figure 17:
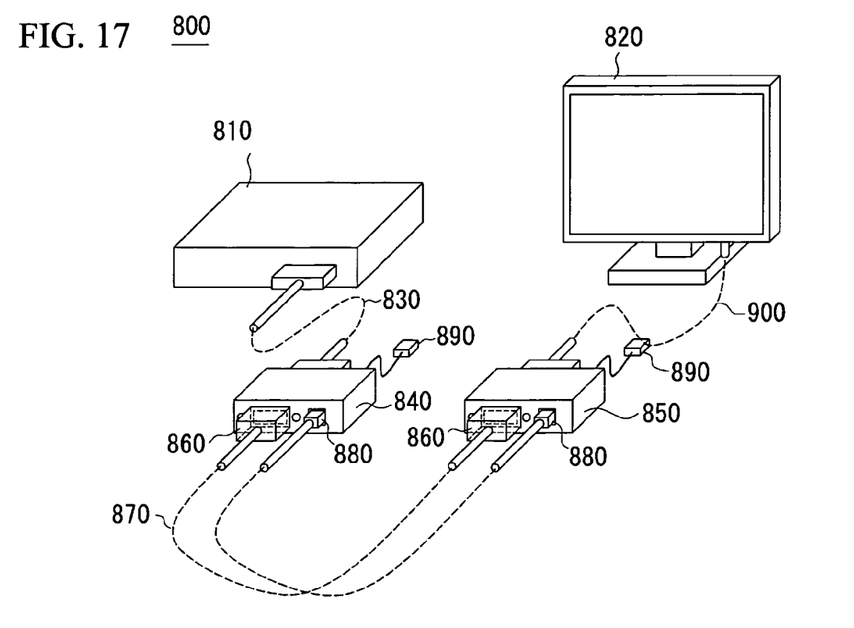
FIG. 17 is a view showing an image transmission system that employs the optical transmission apparatus.
Figure 18:
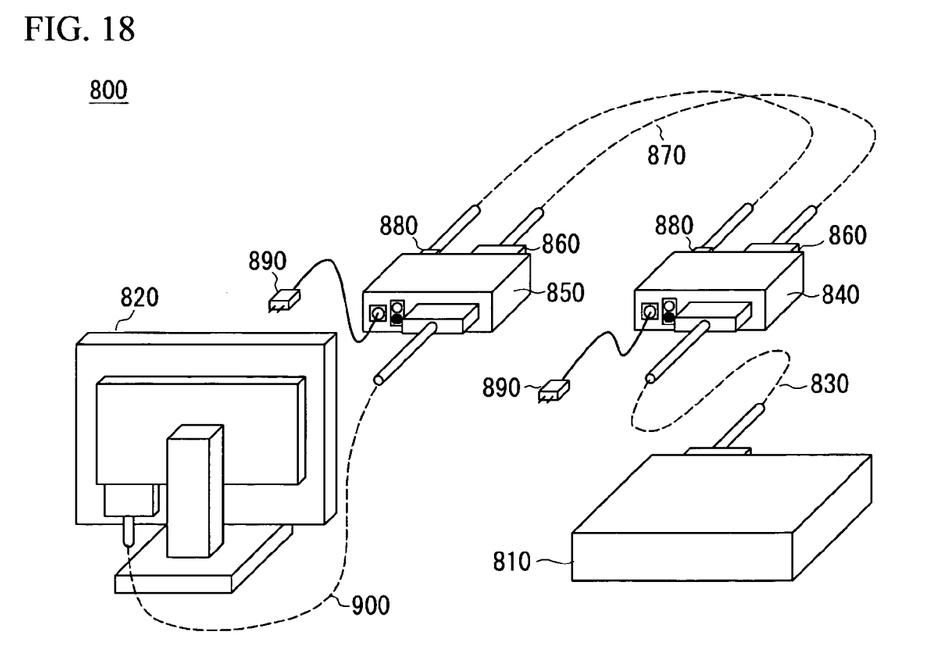
FIG. 18 is a view showing the backside of the image transmission system shown in FIG. 17.

An image transmission system equipped with the optical transmission apparatus 700 is illustrated in FIGS. 17 and 18. Referring to these figures, an image transmission system 800 is equipped with the optical transmission apparatus shown in FIG. 12 for transmitting an image signal generated by an image signal generator 810 to an image display device 820 such as a liquid crystal display. That is to say, the image transmission system 800 includes the image signal generator 810, the image display device 820, a DVI electrical cable 830, a transmission module 840, a reception module 850, an optical connector for image signal transmission, an optical fiber 870, an electrical cable connector 880 for transmission of the image signals, a power adapter 890, and a DVI electrical cable 900.

In the above image transmission system, electric signals are used for transmission between the image signal generator 810 and the transmission module 840, and transmission between the reception module 850 and the image display device 820 by electrical cables 830 and 900. Instead of the electrical cables, optical signals may be employed. For example, signal transmission cables having connectors equipped with an electro-optical converter and an opto-electrical converter may be substituted for the electrical cables 830 and 900.

According to the present invention, the Au-rich layer can be prevented from generating between the electrode and the die attach, by including Au and at least one of the materials, except Au, of the die attach in the electrode of the semiconductor laser diode. It is thus possible to enhance the bonding strength between the electrode and the die attach. This makes it possible to provide the semiconductor laser apparatus with high reliability that can suppress the generation of peeling of the electrode from the semiconductor laser diode. At the same time, metal solder material is employed for the die attach, making it possible to maintain the heat release characteristic of the laser diode and in particular, stabilizing the operation characteristics at high temperatures of VCSEL, which is susceptible to thermal distortion.

The semiconductor laser apparatus in accordance with the present invention is capable of using for a light source of an image storage apparatus or optical communication apparatus, as well as a light source of an image forming apparatus such as a printer, copy machine, or the like.

Although a few embodiments of the present invention have been shown and described, it would be appreciated by those skilled in the art that changes may be made in these embodiments without departing from the principles and spirit of the invention, the scope of which is defined in the claims and their equivalents.

The entire disclosure of Japanese Patent Application No. 2005-237451 filed on Aug. 18, 2005 including specification, claims, drawings, and abstract is incorporated herein by reference in its entirety.

What is claimed is:

1. A semiconductor laser apparatus comprising:
    an electrode of a semiconductor vertical cavity surface emitting laser (VCSEL) diode; and
    a die attach that is used for bonding and is attached to the electrode, wherein
    the electrode of the semiconductor VCSEL diode includes a first electrode layer that includes Au and a second electrode layer that is deposited on the first electrode layer and is at least one of materials that compose the die attach except Au, the second electrode layer intervened between the first electrode layer and the die attach so that the second electrode layer is directly attached to the die attach, wherein:
    the die attach is made of Au—Sn and the second electrode layer is made of Sn, and the electrode is configured to be Au/Ge/Au/Sn.

2. The semiconductor laser apparatus as claimed in claim 1, wherein the second electrode layer serves as an Au-rich suppression layer.

3. The semiconductor laser apparatus as claimed in claim 1, wherein the material of the die attach is an Au—Sn eutectic alloy having a thickness of at least 100 μm.

4. The semiconductor laser apparatus as claimed in claim 1, wherein the electrode of the semiconductor laser diode is formed on a backside of a substrate.

5. A semiconductor vertical cavity surface emitting laser (VCSEL) apparatus comprising:
    a lower reflector deposited on a substrate;
    an active region;
    an upper reflector that composes an oscillator with the lower reflector;

a metal portion in which a first opening is formed to define an emitting region of a laser beam generated in the active region; and a light confinement region having a second opening that defines the emitting region of the laser beam provided between the metal portion and the lower reflector, wherein:

a die attach attached to an electrode of the VCSEL apparatus is provided for bonding; and the electrode of the surface emitting laser diode includes a first electrode layer that includes Au and a second electrode layer that is deposited on the first electrode layer and is at least one of materials that compose the die attach except Au, the second electrode layer intervened between the first electrode layer and the die attach so that the second electrode layer is directly attached to the die attach, wherein:

the die attach is made of Au—Sn and the second electrode layer is made of Sn, and the electrode is configured to be Au/Ge/Au/Sn.

6. The semiconductor VCSEL apparatus as claimed in claim 5, wherein the surface emitting laser diode has a selectively oxidized post structure.

7. The semiconductor VCSEL apparatus as claimed in claim 5, wherein the second opening of the surface emitting laser diode has a diameter equal to or less than 5 μm.

* * * * *